United States Patent
Brunnbauer et al.

(10) Patent No.: US 7,732,242 B2
(45) Date of Patent: Jun. 8, 2010

(54) COMPOSITE BOARD WITH SEMICONDUCTOR CHIPS AND PLASTIC HOUSING COMPOSITION AND METHOD

(75) Inventors: Markus Brunnbauer, Lappersdorf (DE); Jesus Mennen Belonio, Dresden (DE); Edward Fuergut, Dasing (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 408 days.

(21) Appl. No.: 11/680,171

(22) Filed: Feb. 28, 2007

(65) Prior Publication Data

US 2007/0205513 A1    Sep. 6, 2007

(30) Foreign Application Priority Data

Mar. 1, 2006    (DE) .................. 10 2006 009 789.0

(51) Int. Cl.
*H01L 21/00* (2006.01)
(52) U.S. Cl. .................. 438/55; 438/122; 425/89; 264/338; 264/272.17; 257/E23.001
(58) Field of Classification Search .................. 425/89; 264/338, 272.1; 257/E23.001; 438/55, 122
See application file for complete search history.

(56) References Cited

U.S. PATENT DOCUMENTS

| | | | |
|---|---|---|---|
| 5,776,798 A | 7/1998 | Quan et al. | |
| 5,980,683 A * | 11/1999 | Beck et al. | 156/289 |
| 6,255,738 B1 | 7/2001 | Distefano et al. | |
| 6,271,469 B1 | 8/2001 | Ma et al. | |
| 6,278,192 B1 | 8/2001 | Takigawa et al. | |
| 6,873,060 B2 | 3/2005 | Blaszczak et al. | |
| 2002/0190433 A1* | 12/2002 | Shimo et al. | 264/338 |
| 2003/0156000 A1 | 8/2003 | Brunner | |
| 2004/0214377 A1 | 10/2004 | Starkovich et al. | |
| 2006/0278972 A1 | 12/2006 | Bauer et al. | |

FOREIGN PATENT DOCUMENTS

| | | |
|---|---|---|
| DE | 10213296 | 10/2003 |
| DE | 102005026098 | 1/2007 |
| EP | 0611129 | 8/1994 |
| EP | 1189272 | 3/2002 |
| EP | 1282903 | 2/2003 |

* cited by examiner

*Primary Examiner*—Davienne Monbleau
*Assistant Examiner*—Matthew Reames
(74) *Attorney, Agent, or Firm*—Dicke, Billig & Czaja, PLLC

(57) ABSTRACT

One aspect is a composite board including semiconductor chips in semiconductor device positions and a plastic housing composition partly embedding the semiconductor chips. A mould is provided for surrounding the semiconductor chips with plastic housing composition, the mould having a lower part and an upper part and a moldings cavity and the molding cavity having an upper contact area, which forms an interface with the top side of the plastic housing composition to be applied. The upper contact area is covered with a parting layer having essentially the same surface constitution and the same thermal conductivity as an adhesive film forming an interface with the underside of the plastic housing composition, with the result that a warpage of the composite board of less than 1% is obtained.

6 Claims, 3 Drawing Sheets

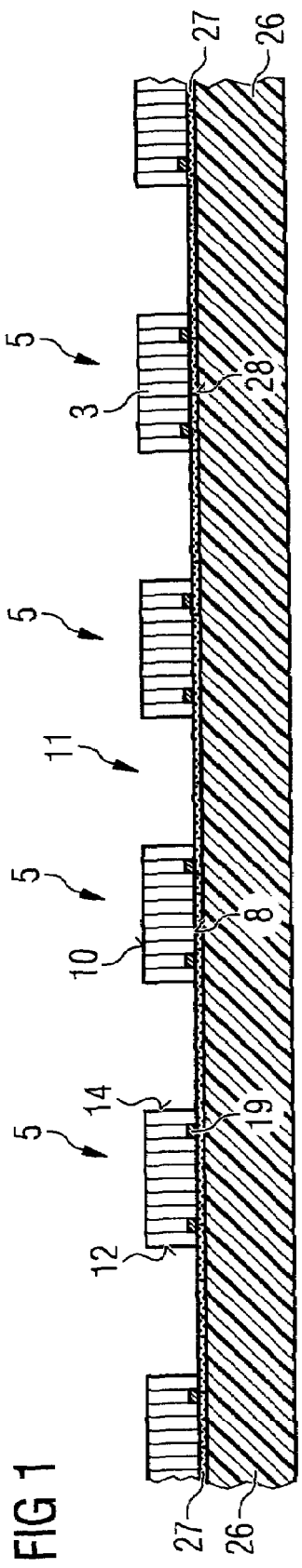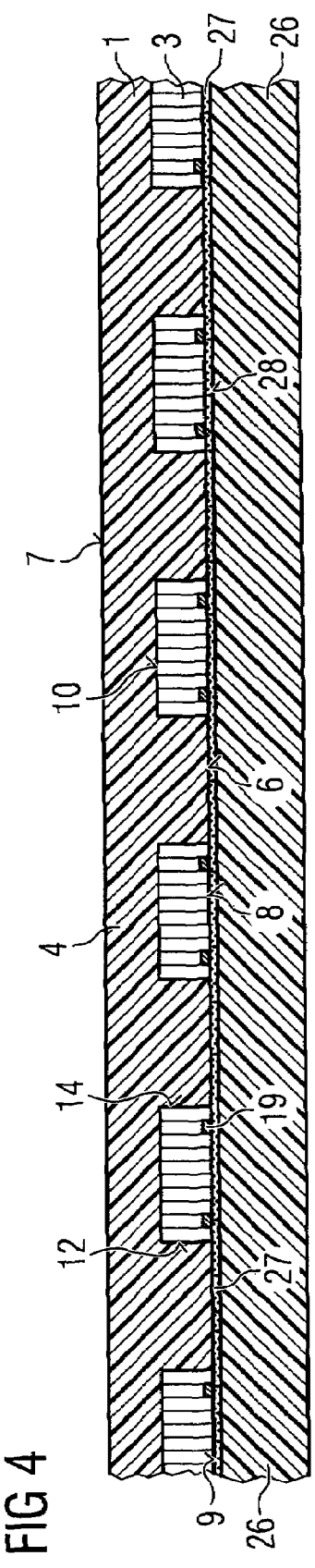

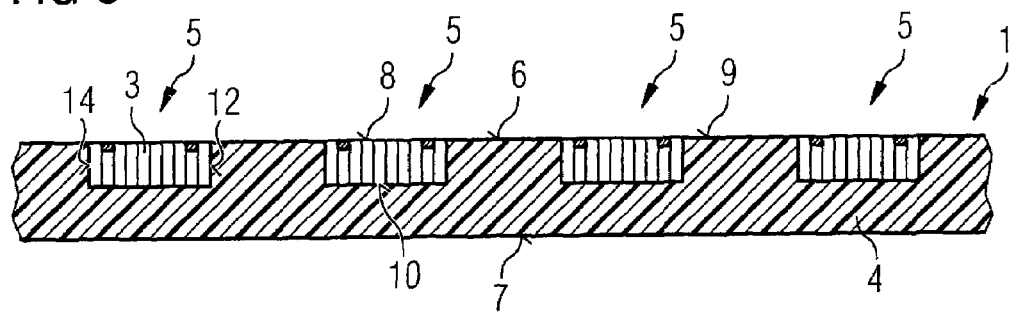
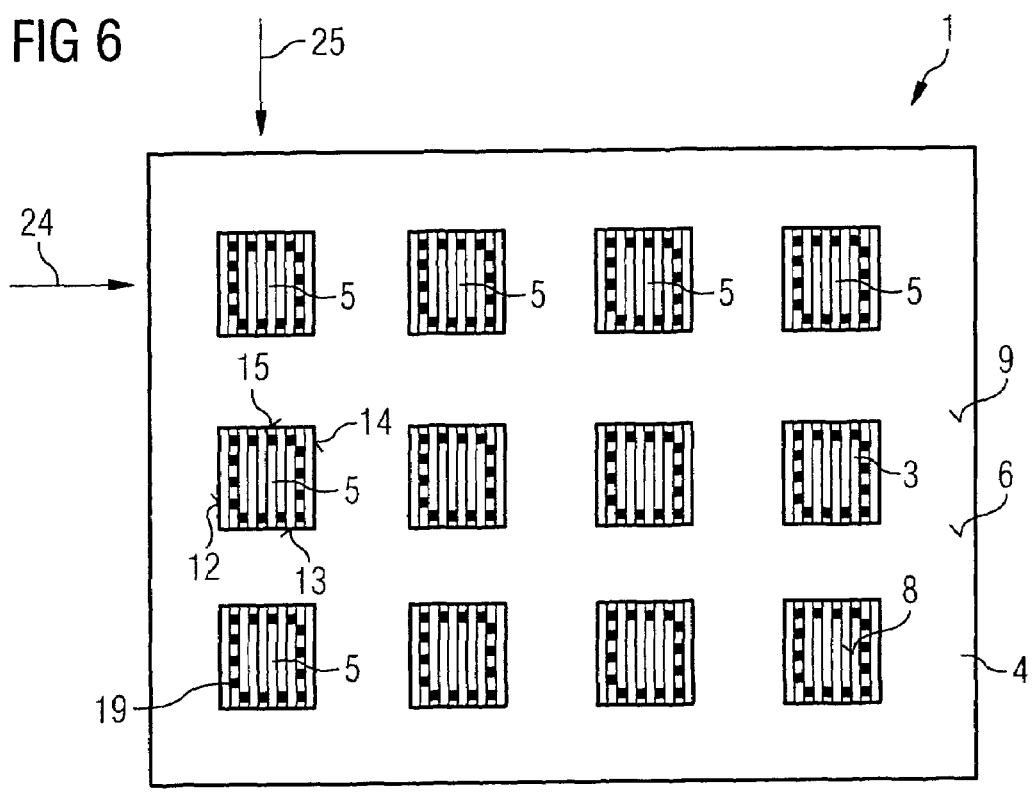

COMPOSITE BOARD WITH SEMICONDUCTOR CHIPS AND PLASTIC HOUSING COMPOSITION AND METHOD

CROSS REFERENCE TO RELATED APPLICATIONS

This Utility Patent Application claims priority to German Patent Application No. DE 10 2006 009 789.0 filed on Mar. 1, 2006, which is incorporated herein by reference.

BACKGROUND

The invention relates to a method for producing a semiconductor device from a composite board with semiconductor chips. The composite board also has a plastic housing composition besides the semiconductor chips.

"Embedded dye" technologies, in which one or even a plurality of semiconductor chips are surrounded with a plastic housing by techniques such as encapsulation by molding, encapsulation by lamination or layer-by-layer construction of the plastic, have numerous advantages over conventional technologies in which the semiconductor chip is applied to a substrate by contacts, such as solder balls, and is subsequently surrounded with a plastic housing. Thus, they permit smaller and lighter devices, by way of example, and enable the fixed connection of a plurality of chips in a single housing and also a higher density of electrical connections.

Moreover, the "embedded dye" technologies afford advantages in production. DE 10 2005 026 098, not published before the priority date, discloses a semiconductor device whose production involves the processing of semiconductor chips by encapsulation by molding into a plastic composition to form a composite board, the active top sides of the semiconductor chips together with the top side of the composite board forming a coplanar area, while their edges and the rear side are covered by the plastic housing composition. A wiring structure with conductor tracks insulated from one another by dielectric layers can be applied to the coplanar area particularly well and precisely.

However, there is the risk of the occurrence of warpage of the composite board caused by the different coefficients of thermal expansion of the materials, leading to locally different degrees of shrinkage of the plastic housing composition during curing and hence to a distortion and warpage of the composite board.

Whereas planar composite boards, which can have the form and dimensions of standard wafers, have the advantage that they can be processed further by standard processes and automatic machines established for wafers, warped composite boards do not have this advantage. On account of their warpage, typically they cannot be processed further or warpage has to be corrected by complicated carrier systems and/or complex aftertreatments such as loading by weights during curing and in all of the following process steps which are accompanied by temperature loadings, that is to say heat up the composite board and/or cool it down again. However, this procedure is extremely complex and therefore cost-intensive. Consequently, the economic advantage actually entailed by the production of semiconductor devices from the composite board cannot be exploited.

SUMMARY

One embodiment includes a composite board with semiconductor chips in semiconductor device positions and a plastic housing composition partly embedding the semiconductor chips. A mould is provided for surrounding the semiconductor chips with plastic housing composition, the mould having a lower part and an upper part and a moldings cavity and the molding cavity having an upper contact area, which forms an interface with the top side of the plastic housing composition to be applied. The upper contact area is covered with a parting layer having essentially the same surface constitution and the same thermal conductivity as an adhesive film forming an interface with the underside of the plastic housing composition, with the result that a warpage of the composite board of less than 1% is obtained.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic cross section through a carrier with semiconductor chips applied thereto.

FIG. 4 illustrates a schematic cross section through the carrier with semiconductor chips embedded into a plastic housing composition.

FIG. 5 illustrates a schematic cross section through a self-supporting composite board including the semiconductor chips embedded into the plastic housing composition.

FIG. 6 illustrates a plan view of the composite board.

DETAILED DESCRIPTION

Figure 2:
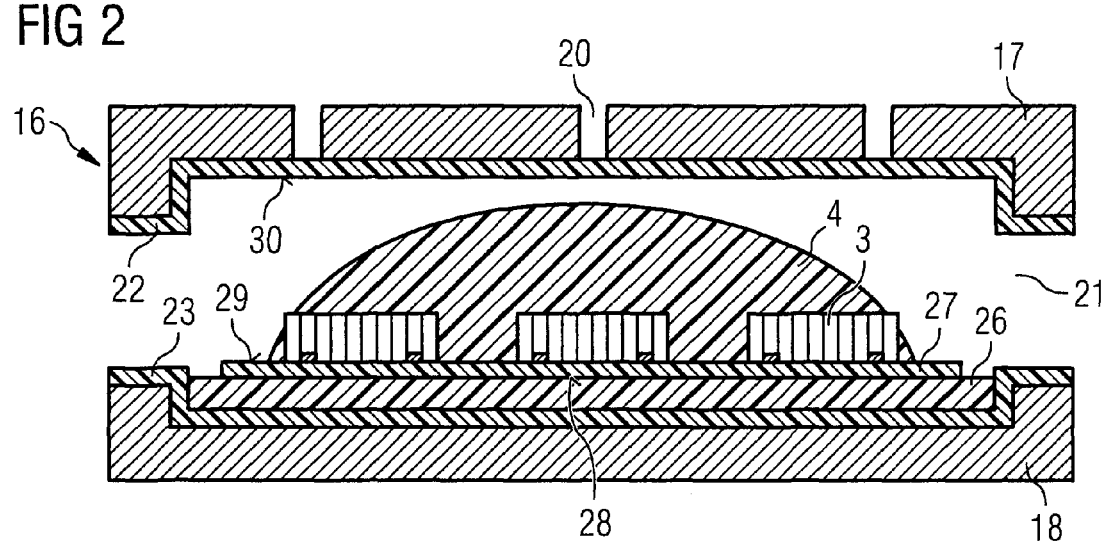
FIG. 2 illustrates a schematic cross section through the carrier in a mould.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention specifies a method for producing semiconductor devices from a composite board by which the warpage of the composite board that occurs during the molding process and the curing process can be significantly reduced in a simple manner.

Moreover, one embodiment of the present invention specifies a composite board which permits a further economic processing and singulation to form semiconductor devices.

A method according to one embodiment of the invention for producing semiconductor devices includes: firstly, a semiconductor wafer is produced and separated into a multiplicity of semiconductor chips having active top sides, edge sides and rear sides. In addition, a carrier having a top side and an underside is provided, the carrier having the form and dimensions of a wafer. The top side of the carrier is covered with an adhesive film, which is adhesive on both sides. The carrier is then populated with semiconductor chips in semiconductor device positions, the semiconductor chips being fixed with their active top sides on the adhesive film in rows and columns.

For the purpose of surrounding the semiconductor chips with plastic housing composition in a molding process, a mould is provided, the mould having a lower part and an upper part and a molding cavity and the molding cavity having an upper contact area, which forms an interface with the top side of the plastic housing composition to be applied. The upper contact area is covered with a parting layer having essentially the same surface constitution and the same thermal conductivity as the adhesive film, with the result that a warpage of the composite board of less than 1% is obtained. The carrier populated with semiconductor chips is introduced into the molding cavity and the semiconductor chips are embedded at least with their edge sides into the plastic housing composition. This gives rise to a composite board including the plastic housing composition and the semiconductor chips with a top side which forms a coplanar area with the top sides of the semiconductor chips.

After a curing step, the composite board can be removed from the mould and the carrier together with the adhesive film can be removed, thereby producing a self-supporting, largely warpage-free panel which—for example after the application of a wiring structure and of external contacts—can be separated into individual semiconductor devices.

In order to control the warpage of the composite board that forms during the molding process, the adsorption properties of the plastic housing composition can be controlled with respect to the surfaces that come into contact with it during molding. If the surfaces are very different, that is to say if they have different physi- and chemisorption conditions, surface roughnesses and thermal conduction properties, then they influence the shrinkage of the plastic housing composition during molding and subsequent curing in different ways. However, it is precisely different degrees of shrinkage of the plastic housing composition on the top side and the underside of the composite board that lead to warpage of the composite board.

As has been found, a virtually warpage-free composite board can be produced by the use of similar or even identical materials for the adhesive film and the parting layer. In this context, "similar" materials are understood to mean materials whose surface and thermal conduction properties are sufficiently comparable, with the result that a largely identical degree of shrinkage of the plastic housing composition is obtained at the surfaces.

With the method according to one embodiment of the invention, the warpage of the composite board that occurs during molding is largely prevented by extremely simple means. Consequently, the composite board can be processed further by standard technologies without any problems and be provided with a wiring structure and external contacts, for which a surface that is as planar as possible, inter alia, in photolithographic processes.

In one example, an epoxy resin with a proportion of quartz glass as filler is used as the plastic housing composition, the proportion of the filler in the plastic housing composition amounting to 70-95 per cent by mass. It is thereby possible also to largely eliminate a residual warpage of the composite board which arises as a result of the different properties of the plastic and the semiconductor chips.

For particularly low warpage, a specific size distribution of the particles which form the filler should be provided. The size distribution should satisfy the following relationship, the size distribution being given by the percentage proportion of the cumulative number of particles:

$$D_{10} \geq \tfrac{1}{10} \cdot D_{50}$$

$$D_{90} \leq 10 \cdot D_{50},$$

where $D_{10}$, $D_{50}$ and $D_{90}$ are particle diameters for cumulative numbers of particles. The average particle diameter typically lies between 20 μm and 55 μm.

A composite board according to an embodiment of the invention including semiconductor chips in semiconductor device positions and an injection-molded plastic housing composition embedding at least edge sides of the semiconductor chips 3, in which a top side of the composite board forms a coplanar area with the top sides of the semiconductor chips, has a warpage of less than 1%. This relative warpage is understood to mean the deviation of the composite board from an ideally planar board relative to the total area of the composite board. In the case of a composite board having a diameter of 200 mm, the deviation from the ideally planar board therefore amounts to at most 2 mm.

Individual manufacturing stages of a composite board 1 are illustrated on the basis of schematic cross sections in FIGS. 1 to 5. A first method step, in which firstly a semiconductor wafer is produced and is subsequently singulated into semiconductor chips, is not illustrated. FIG. 1 first illustrates the result of the subsequent method step, in which the semiconductor chips 3, for example after a previous functional test, are placed onto a carrier 26 in semiconductor device positions 5. The carrier may have the form and the dimensions of a wafer, with the result that in the subsequent method processes an artificial wafer is produced which can be processed in a particularly simple manner by automatic machines that are present anyway. By way of example, metals, silicon or polymers are suitable as material for the carrier.

The semiconductor chips 3 are not arranged closely alongside one another but rather interspaces 11 are left free between the individual semiconductor chips 3, the interspaces later, having been filled with plastic housing composition, becoming housing walls of semiconductor devices.

The semiconductor chips 3 are fixed with their active top sides 8 and the contact areas 19 situated thereon on the top side 28 of the carrier 26 with the aid of an adhesive film 27, which is a double-sided adhesive film. In order to apply the semiconductor chips 3 into the semiconductor device positions 5, an automatic placement machine (not illustrated) is used which picks up the parts of a semiconductor wafer that have been separated into semiconductor chips 3 and exactly positions and fixes them with the aid of the film 27 on the top side 28 of the carrier 26.

Afterwards, the semiconductor chips 3 are embedded into a plastic housing composition 4 in order to form chip scale packages, as illustrated in FIG. 2. For this purpose, the carrier 26 with the semiconductor chips 3 fixed thereon is introduced into a molding cavity 21 of a mould 16 having a lower part 18 for receiving the carrier 26 and an upper part 17 for closing the mould 16. The upper part 17 of the mould 16 is covered on its inner side with a parting layer 22 having an upper contact area 30 with respect to the plastic housing composition 4. The lower part 18 of the mould 16 is covered with a further parting layer 23 on its inner side. The parting layer 22 and/or the further parting layer 23 may be for example a coating of the mould 16 with a suitable material or a film inserted into the mould 16.

Figure 3:
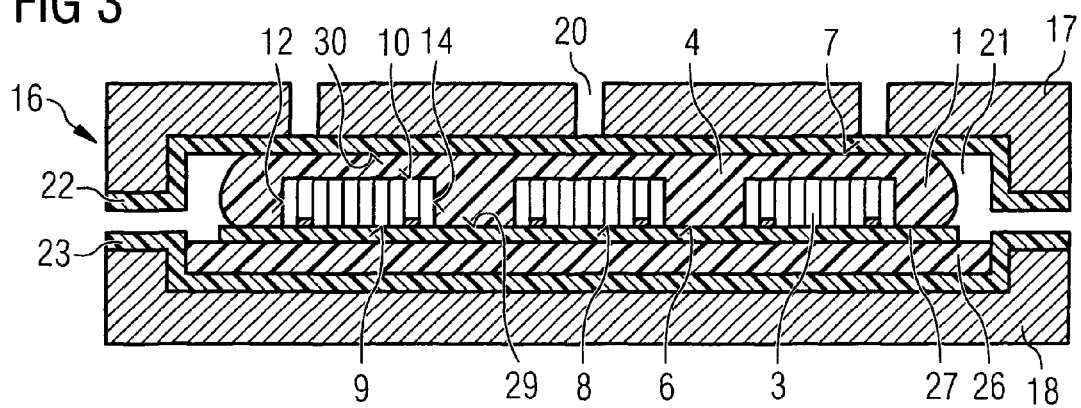
FIG. 3 illustrates a schematic cross section through the carrier in the mould at the end of the molding process.

The semiconductor chips 3 are embedded into a plastic housing composition 4 by compression or transfer molding, with the formation, as illustrated in FIG. 3, of a composite board 1 made from the plastic housing composition 4 and the semiconductor chips 3. While the composite board 1 is situated within the molding cavity 21, it is bounded by the parting layer 22 at the top and by the adhesive film 27 at the bottom. As has been found, in order to produce a composite board 1 that is as free of warpage as possible, it is crucial for the constitution of the interfaces between the parting layer 22 and the adhesive film 27 respectively and the composite board 1, that is to say the upper contact area 30 and the lower contact area 29, to be as far as possible of identical type. The upper contact area 30 and the lower contact area 29 therefore have essentially the same properties with regard to their surface roughness, the physi- and chemisorption with respect to the plastic housing composition 4, and their thermal conductivity. What is thereby achieved is that the shrinkage of the plastic housing composition 4 that occurs during molding and subsequent curing is to essentially the same degree on the top side 6 and the underside 7 of the composite board 1, and stresses in the plastic housing composition 4 which result in warpage of the composite board 1 are therefore avoided.

The same material can be used for the parting layer 22 and the adhesive film 27, in order to obtain an ideal matching of the properties. However, it is also possible only to use similar materials, for example plastic films, which match to the greatest possible degree in terms of their properties that influence the shrinkage of the plastic housing composition 4.

The warpage of the composite board 1 can be very greatly reduced in this way, a small residual warpage resulting from the composite character of the composite board 1, that is to say from the different material properties of the plastic housing composition 4 and the semiconductor chips 3. A plastic housing composition 4 with quartz glass as filler is therefore used as a further measure for avoiding warpage. The use of the filler with a proportion by mass of 70 to 95% makes it possible largely to imitate the material properties of the semiconductor chips that influence the shrinkage in the plastic housing composition 4, with the result that a significant reduction of warpage is once again achieved.

FIG. 4 illustrates a schematic cross section through the carrier 26 after application of a plastic housing composition 4 into the interspaces 11 between the semiconductor chips 3 and also to their rear sides 10. In this case, the active top sides 8 of the semiconductor chips 3 together with the plastic housing composition 4 form a coplanar area 9 of the composite board 1.

After the curing of the plastic housing composition 4, a stable, self-supporting composite board 1 having semiconductor chips 3 embedded in the plastic housing composition 4 has formed and the carrier 26 is removed together with the adhesive film 27. The carrier 26 can be removed by heating the composite board 1 and the carrier 26, in which case the double-sided adhesive film 27 loses its adhesion effect and the carrier 26 can be stripped away from the top side 6 of the composite board 1 without considerable action of force on the composite board 1. The result of this method process is illustrated in FIG. 5.

The active top side 8 of the semiconductor chips 3 is then freely accessible, with the result that both the contact areas 19 and the remaining surface 8 of the semiconductor chips 3 and also of the plastic housing composition 4 are available for photolithographic methods. For this purpose, it is particularly important for the composite board 1 to be as free of warpage as possible. By coordinating the properties of upper and lower contact areas and by using quartz glass as filler in the plastic housing composition 4, it is possible to reduce the warpage of the composite board 1 to less than 1%.

FIG. 6 illustrates a schematic plan view of a composite board 1 of a panel. The panel 1 illustrated here is only a detail from a panel having the form and the dimensions of a semiconductor wafer. A multiplicity of semiconductor device positions 5 are arranged with at least in each case one semiconductor chip 3 in rows 24 and columns 25 in a plastic housing composition 4 in such a way that in each case the edge sides 12, 13, 14 and 15 and also the rear side 10—not visible in FIG. 6—of the semiconductor chips 3 are embedded by the plastic housing composition 4, while the active top side 8—visible here—of the semiconductor chips 3 is freely accessible. The rear side 10 can, but need not, be embedded into the plastic housing composition 4.

The plastic housing composition 4 and the active top sides 8 of the semiconductor chips 3 form a coplanar top side 6 of the composite board 1. On the coplanar top side 6 of the composite board 1, contact areas 19 are arranged in the region of the active top sides 8 of the semiconductor chips 3 and are electrically connected to the individual semiconductor elements of an integrated circuit of the semiconductor chip 3.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing semiconductor devices, comprising:
   producing a semiconductor wafer;
   separating the semiconductor wafer into a multiplicity of semiconductor chips having active top sides, edge sides and rear sides;
   providing a carrier having a top side and an underside, the carrier having the form and dimensions of a wafer, and covering of its top side with an adhesive film, which is adhesive on both sides;
   populating the carrier with semiconductor chips in semiconductor device positions, the semiconductor chips being fixed with their active top sides on the adhesive film in rows and columns;
   providing a mould for surrounding the semiconductor chips with plastic housing composition, the mould having a lower part and an upper part and a molding cavity and the molding cavity having an upper contact area, which forms an interface with the top side of the plastic housing composition to be applied, the upper contact area being covered with a parting layer having essentially the same surface constitution and the same thermal conductivity as the adhesive film, with the result that a warpage of the composite board of less than 1% is obtained;
   introducing of the carrier populated with the semiconductor chips into the molding cavity and embedding the semiconductor chips at least with their edge sides into the plastic housing composition with formation of a composite board having a top side which forms a coplanar area with the top sides of the semiconductor chips;

curing the plastic housing composition and removing the composite board from the mould;

removing the carrier with formation of a self-supporting warpage-free panel; and separating the panel into individual semiconductor devices.

2. The method according to claim 1, wherein an epoxy resin with a proportion of quartz glass as filler is used as the plastic housing composition.

3. The method according to claim 2, wherein the proportion of the filler in the plastic housing composition amounts to 70-95 percent by mass.

4. The method according to claim 2, wherein the particles that form the filler have a size distribution which satisfies the following relationship, the size distribution being given by the percentage proportion of the cumulative number of particles:

$$D_{10} \geq \tfrac{1}{10} \cdot D_{50}$$

$$D_{90} \leq 10 \cdot D_{50},$$

where $D_{10}$, $D_{50}$ and $D_{90}$ are particle diameters for cumulative numbers of particles.

5. method according to claim 1, wherein the same material is used for the adhesive film and the parting layer.

6. The method for producing semiconductor devices, comprising:

separating a semiconductor wafer into a multiplicity of semiconductor chips having active top sides, edge sides and rear sides;

providing a carrier having a top side and an underside, and covering of its top side with an adhesive film, which is adhesive on both sides;

populating the carrier with semiconductor chips in semiconductor device positions, the semiconductor chips being fixed with their active top sides on the adhesive film in rows and columns;

providing a mould for surrounding the semiconductor chips with plastic housing composition, the mould having a lower part and an upper part and a molding cavity and the molding cavity having an upper contact area, which forms an interface with the top side of the plastic housing composition to be applied, the upper contact area being covered with a parting layer having essentially the same surface constitution and the same thermal conductivity as the adhesive film;

introducing of the carrier populated with the semiconductor chips into the molding cavity and embedding the semiconductor chips at least with their edge sides into the plastic housing composition with formation of a composite board having a top side;

curing the plastic housing composition and removing the composite board from the mould;

removing the carrier with formation of a self-supporting panel; and separating the panel into individual semiconductor devices.

* * * * *

UNITED STATES PATENT AND TRADEMARK OFFICE
CERTIFICATE OF CORRECTION

PATENT NO. : 7,732,242 B2  Page 1 of 1
APPLICATION NO. : 11/680171
DATED : June 8, 2010
INVENTOR(S) : Brunnbauer et al.

It is certified that error appears in the above-identified patent and that said Letters Patent is hereby corrected as shown below:

Title Page, Inventors, delete "Jesus Mennen Belonio, Dresden (DE)" and insert in place thereof --Jesus Mennen Belonio, Munich (DE)--.

Column 7, line 23, delete "method" and insert in place thereof --The method--.

Column 7, line 25, delete "The" and insert in place thereof --A--.

Signed and Sealed this

Nineteenth Day of October, 2010

David J. Kappos
*Director of the United States Patent and Trademark Office*